United States Patent
Kim et al.

(10) Patent No.: US 9,997,720 B2
(45) Date of Patent: Jun. 12, 2018

(54) ORGANIC LIGHT EMITTING DIODE DISPLAY

(71) Applicant: SAMSUNG DISPLAY CO., LTD., Yongin, Gyeonggi-Do (KR)

(72) Inventors: Myeong Suk Kim, Hwaseong-si (KR); Dae Yup Shin, Suwon-si (KR); Sung Wook Kim, Hwaseong-si (KR); Hwan Hee Cho, Goyang-si (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 259 days.

(21) Appl. No.: 14/755,879

(22) Filed: Jun. 30, 2015

(65) Prior Publication Data

US 2016/0197290 A1     Jul. 7, 2016

(30) Foreign Application Priority Data

Jan. 7, 2015   (KR) ........................ 10-2015-0002074

(51) Int. Cl.
  *H01L 51/50*    (2006.01)
  *H01L 51/00*    (2006.01)
  *C09K 11/06*    (2006.01)
  *C09K 11/02*    (2006.01)

(52) U.S. Cl.
  CPC ........ *H01L 51/0072* (2013.01); *C09K 11/025* (2013.01); *C09K 11/06* (2013.01);
  (Continued)

(58) Field of Classification Search
  CPC combination set(s) only.
  See application file for complete search history.

(56) References Cited

U.S. PATENT DOCUMENTS

2004/0185299 A1* 9/2004 Ly ........................ C07D 401/14
                                                              428/690
2005/0236970 A1* 10/2005 Matsudate .......... H01L 27/3244
                                                              313/500

FOREIGN PATENT DOCUMENTS

JP      2005-302667      10/2005
KR    2011-0105800 A     9/2011
(Continued)

OTHER PUBLICATIONS

Machine translation of Suk et al KR 2014 0083189 generated Mar. 14, 2017.*

*Primary Examiner* — Jennifer A Chriss
*Assistant Examiner* — Sean M DeGuire
(74) *Attorney, Agent, or Firm* — Lee & Morse, P.C.

(57) ABSTRACT

An organic light emitting display element according to an example embodiment includes: a first electrode, an emission layer positioned on the first electrode, and a second electrode positioned on the emission layer, in which the emission layer includes at least one of the compounds represented by the following Chemical Formulas 1 to 3.

Chemical Formula 1

Chemical Formula 2

(Continued)

-continued

Chemical Formula 3

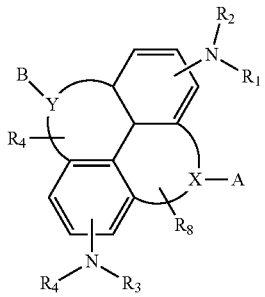

3 Claims, 2 Drawing Sheets

(52) U.S. Cl.
CPC ...... *H01L 51/0052* (2013.01); *H01L 51/0061* (2013.01); *C09K 2211/1007* (2013.01); *C09K 2211/1011* (2013.01); *C09K 2211/1044* (2013.01); *H01L 51/5012* (2013.01)

(56) References Cited

FOREIGN PATENT DOCUMENTS

| KR | 2012-0122982 A | 11/2012 |
| KR | 2013-0007495 A | 1/2013 |
| KR | 2014/0083189 | * 7/2014 |

* cited by examiner

ORGANIC LIGHT EMITTING DIODE DISPLAY

CROSS-REFERENCE TO RELATED APPLICATION

Korean Patent Application No. 10-2015-0002074, filed on Jan. 7, 2015, in the Korean Intellectual Property Office, and entitled: "Organic Light Emitting Diode Display," is incorporated by reference herein in its entirety.

BACKGROUND

1. Field

Embodiments relate to an organic light emitting diode display.

2. Description of the Related Art

An organic light emitting diode display is a self-light emitting display device displaying an image by light emitted from an organic light emitting element.

In a structure of a general organic light emitting diode display, there is a substrate, a pixel electrode is positioned on the substrate, an organic layer including an emission layer (EML) is positioned on the pixel electrode, and a counter electrode is positioned on the organic layer. The organic layer may include another layer helping injection or transferring of holes between the pixel electrode and the emission layer, and another layer helping injection or transferring of electrons between the emission layer (EML) and a common electrode.

A driving principle of the organic light emitting diode display having the aforementioned structure is as follows. If a voltage is applied between the pixel electrode and the common electrode, the holes are injected into the emission layer through the layer helping injection or transferring of the holes from the pixel electrode, and the electrons are injected into the emission layer through the layer helping injection or transferring of the electrons from the common electrode. The holes and the electrons injected into the emission layer are recombined in the emission layer to generate an exciton, and light is emitted while the exciton is transferred from an excited state to a ground state. In this case, light is emitted by the generated energy, and the organic light emitting diode display displays an image by using the emitted light.

The above information disclosed in this Background section is only for enhancement of understanding of the background of the invention and therefore it may contain information that does not form the prior art that is already known in this country to a person of ordinary skill in the art.

SUMMARY

Embodiments are directed to an organic light emitting display element, including a first electrode, an emission layer positioned on the first electrode, and a second electrode positioned on the emission layer. The emission layer may include at least one of the compounds represented by the following Chemical Formulas 1 to 3:

Chemical Formula 1

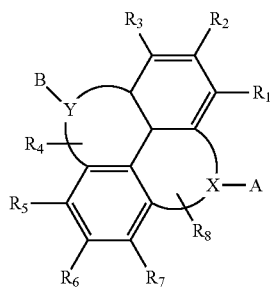

Chemical Formula 2

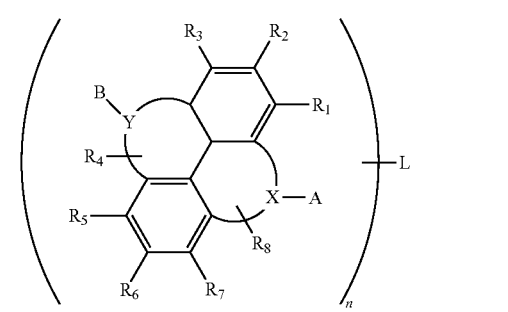

Chemical Formula 3

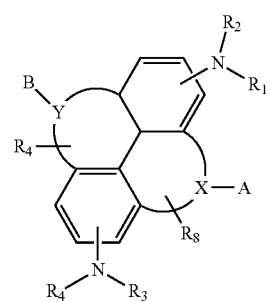

In Chemical Formulas 1, 2, and 3,

X and Y are each independently O, S, N, or Si,

A and B are optionally independently included and, when included, are each independently a hydrogen atom, a deuterium atom, a halogen atom, a cyano group, a hydroxy group, a nitro group, a substituted or unsubstituted alkyl group having 1 to 30 carbon atoms, a substituted or unsubstituted cycloalkyl group having 3 to 10 carbon atoms, a substituted or unsubstituted alkylsilyl group having 3 to 30 carbon atoms, a substituted or unsubstituted arylsilyl group having 6 to 30 carbon atoms, a substituted or unsubstituted heteroaryl group having 4 to 30 carbon atoms, a substituted or unsubstituted condensed polycyclic group having 6 to 30 carbon atoms, a substituted or unsubstituted aryl group having 6 to 30 carbon atoms, an amine group substituted by a substituted or unsubstituted aryl group having 6 to 30 carbon atoms, an amine group substituted by a substituted or unsubstituted heteroaryl group having 4 to 30 carbon atoms, or an amine group substituted by a substituted or unsubstituted condensed polycyclic group having 6 to 30 carbon atoms, provided that at least one of $R_1$ to $R_8$ is an amine group substituted by a substituted or unsubstituted aryl group having 6 to 30 carbon atoms, an amine group substituted by a substituted or unsubstituted heteroaryl group having 4 to 30 carbon atoms, or an amine group substituted by a substituted or unsubstituted condensed polycyclic group having 6 to 30 carbon atoms, $R_1$ to $R_8$ are each independently a hydrogen atom, a deuterium atom, a halogen atom, a cyano group, a hydroxy group, a nitro group, a substituted or unsubstituted alkyl group having 1 to 30 carbon atoms, a substituted or unsubstituted cycloalkyl group having 3 to 10 carbon atoms, a substituted or unsubstituted alkylsilyl group having 3 to 30 carbon atoms, a substituted or unsubstituted arylsilyl group having 6 to 30 carbon atoms, a substituted or unsubstituted heteroaryl group having 4 to 30 carbon atoms, a substituted or unsubstituted condensed polycyclic group having 6 to 30 carbon atoms, a substituted or unsubstituted aryl group having 6 to 30 carbon atoms, an amine group substituted by a substituted or unsubstituted aryl group having 6 to 30 carbon atoms, an amine group substituted by a substituted or unsubstituted heteroaryl group having 4 to 30 carbon atoms, or an amine group substituted by a substituted or unsubstituted condensed polycyclic group having 6 to 30 carbon atoms, provided that at least one of $R_1$ to $R_8$ is an amine group substituted by a substituted or unsubstituted aryl group having 6 to 30 carbon atoms, an amine group substituted by a substituted or unsubstituted heteroaryl group having 4 to 30 carbon atoms, or an amine group substituted by a substituted or unsubstituted condensed polycyclic group having 6 to 30 carbon atoms, and L is a ligand.

The ligand may include one or more of a substituted or unsubstituted alkyl group having 1 to 30 carbon atoms and a substituted or unsubstituted aryl group having 6 to 30 carbon atoms.

X and Y may form a cycle.

The compound represented by Chemical Formulas 1 to 3 may be a blue dopant.

Embodiments are also directed to an organic light emitting diode display, including an insulation substrate, a thin film transistor positioned on the insulation substrate, and an organic light emitting display element according to an embodiment, wherein the first electrode is connected to the thin film transistor.

The ligand may include one or more of a substituted or unsubstituted alkyl group having 1 to 30 carbon atoms and a substituted or unsubstituted aryl group having 6 to 30 carbon atoms.

X and Y may form a cycle.

The compound represented by Chemical Formulas 1 to 3 may be a blue dopant.

The organic light emitting diode display may further include a hole injection layer and a hole transport layer positioned on the first electrode.

The hole transport layer may include a compound represented by the following Chemical Formulas 4 and 5:

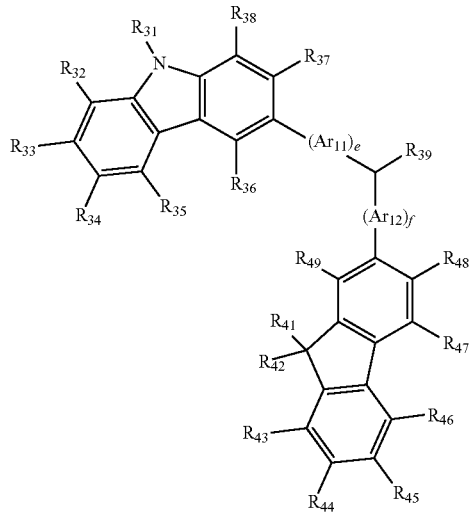

Chemical Formula 4

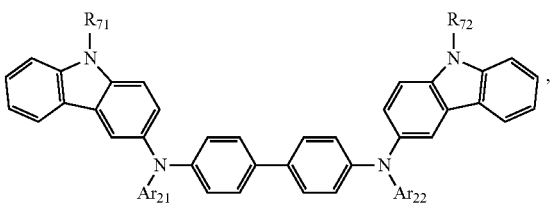

Chemical Formula 5

In Chemical Formulas 4 and 5, $Ar_{11}$, $Ar_{12}$, $Ar_{21}$, and $Ar_{22}$ may each independently be a substituted or unsubstituted C6-C60 arylene group, e and f may each independently be an integer of 0 to 5, $R_{31}$ to $R_{38}$, $R_{41}$ to $R_{49}$, and $R_{71}$ and $R_{72}$ may each independently be hydrogen, deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, a substituted or unsubstituted C3-C60 cycloalkyl group, a substituted or unsubstituted C6-C60 aryl group, a substituted or unsubstituted C6-C60 aryloxy group, or a substituted or unsubstituted C6-C60 arylthio group, and $R_{39}$ may be any one of a phenyl group, a naphthyl group, an anthryl group, a biphenyl group, a pyridyl group, deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted C1-C20 alkyl group, and a substituted or unsubstituted C1-C20 alkoxy group.

The organic light emitting diode display may further include an electron injection layer and an electron transport layer positioned on the emission electrode.

Embodiments are also directed to an organic light emitting diode display, including an organic light emitting diode, the organic light emitting diode including an emission layer that contains a compound represented by the following Chemical Formula A:

Chemical Formula A

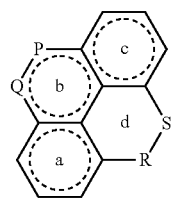

In Chemical Formula A, rings a, b, and c may be aromatic, dotted lines therein indicating aromaticity of the rings.

P and Q of ring b may be N or CH, one of P and Q being N and the other of P and Q being CH, R and S of ring d maybe NR' or $CH_2$, one of R and S being NR' and the other of R and S being $CH_2$, R' may be a substituted or unsubstituted aryl group having 6 to 30 carbon atoms, a substituted or unsubstituted condensed polycyclic group having 6 to 30 carbon atoms, an amine group substituted by a substituted or unsubstituted heteroaryl group having 4 to 30 carbon atoms, or an amine group substituted by a substituted or unsubstituted condensed polycyclic group having 6 to 30 carbon atoms, rings a and c may independently be unsubstituted or substituted with one or more of a halogen atom, a cyano group, a hydroxy group, a nitro group, a substituted or unsubstituted alkyl group having 1 to 30 carbon atoms, a substituted or unsubstituted cycloalkyl group having 3 to 10 carbon atoms, a substituted or unsubstituted alkylsilyl group having 3 to 30 carbon atoms, a substituted or unsubstituted arylsilyl group having 6 to 30 carbon atoms, a substituted or unsubstituted heteroaryl group having 4 to 30 carbon atoms, a substituted or unsubstituted condensed polycyclic group having 6 to 30 carbon atoms, a substituted or unsubstituted aryl group having 6 to 30 carbon atoms, an amine group substituted by a substituted or unsubstituted aryl group having 6 to 30 carbon atoms, an amine group substituted by a substituted or unsubstituted heteroaryl group having 4 to 30 carbon atoms, or an amine group substituted by a substituted or unsubstituted condensed polycyclic group having 6 to 30 carbon atoms.

The compound represented by Chemical Formula A may be represented by one of the following Chemical Formulas B-1, B-2, B-3, B-5, B-6, B7, or B-8:

B-1

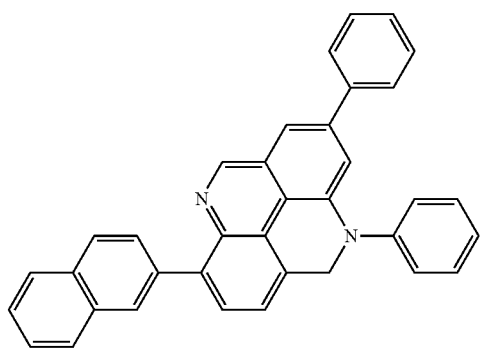

B-2

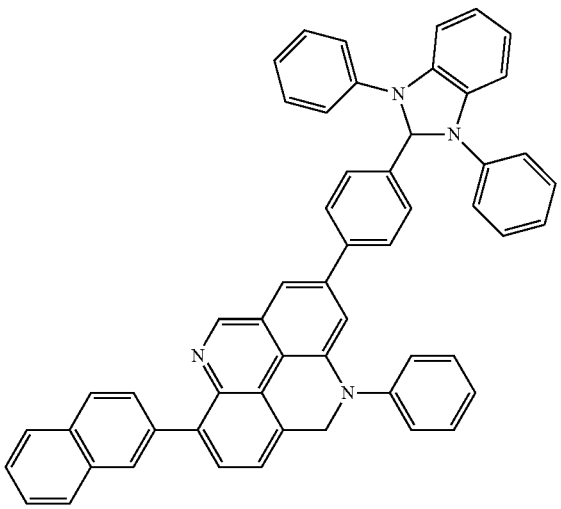

B-3

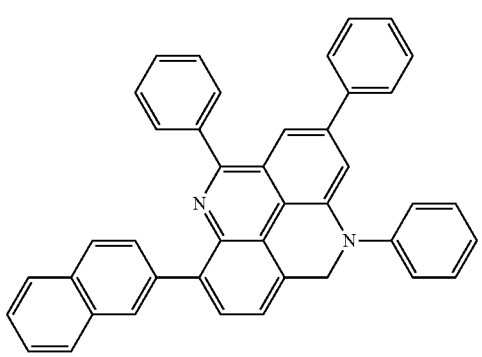

B-5

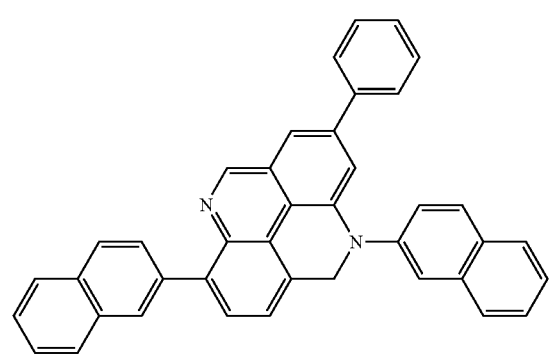

B-6

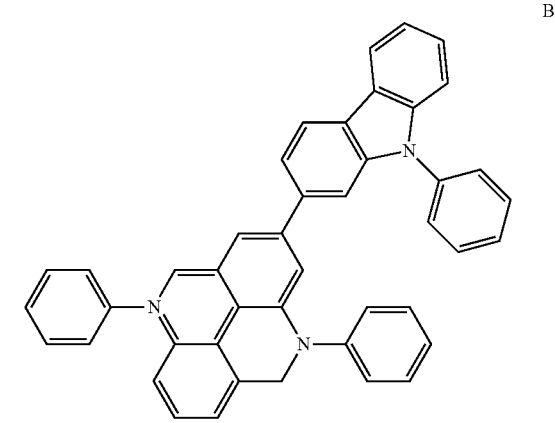

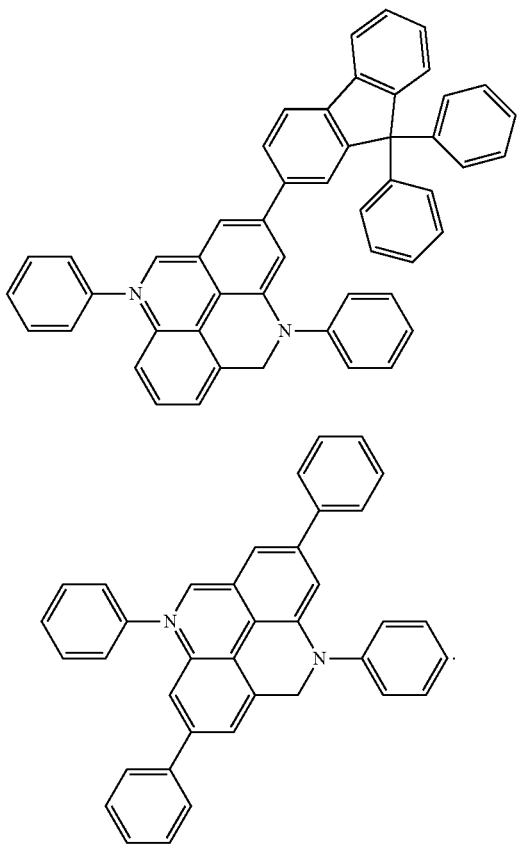

B-7

B-8

The compound represented by Chemical Formula A may be a dopant in the emission layer, the dopant being mixed in the emission layer with a host, the host including one or more of carbazole biphenyl, 1,3-di(9H-carbazol-9-yl)benzene, or 9,10-di(2-naphthyl)anthracene, the host and the dopant operating to emit blue light.

BRIEF DESCRIPTION OF THE DRAWINGS

Features will become apparent to those of skill in the art by describing in detail example embodiments with reference to the attached drawings in which.

<Description of symbols>

Figure 1:
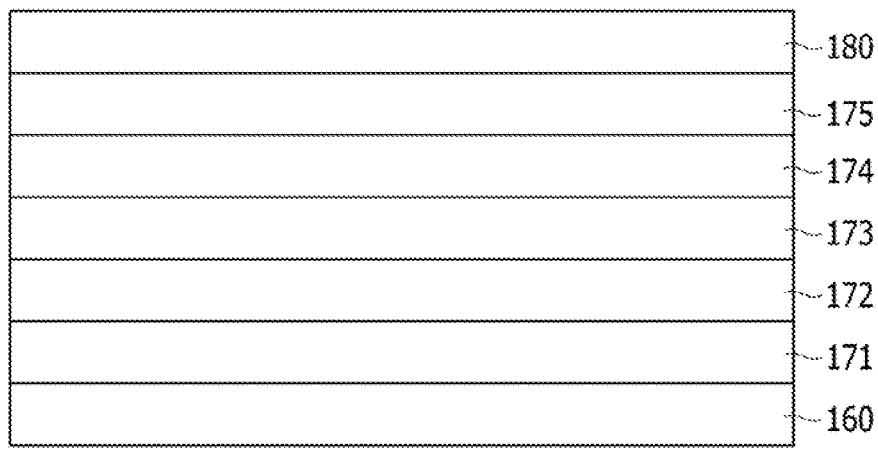
FIG. 1 illustrated a cross-sectional view of an organic light emitting display element.

| | |
|---|---|
| 123: Substrate | 130: Thin film transistor |
| 160: First electrode | 180: Second electrode |
| 171: Hole injection layer | 172: Hole transport layer |
| 173: Emission layer | 174: Electron transport layer |
| 175: Electron injection layer | |

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey example implementations to those skilled in the art.

In the drawing figures, the dimensions of layers and regions may be exaggerated for clarity of illustration. Like reference numerals refer to like elements throughout.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Now, an organic light emitting display element according to an example embodiment will be described with reference to FIG. 1.

FIG. 1 is a cross-sectional view of the organic light emitting display element according to the example embodiment.

The organic light emitting display element according to the present example embodiment has a structure where a first electrode 160, a hole injection layer 171, a hole transport layer 172, an emission layer 173, an electron transport layer 174, an electron injection layer 175, and a second electrode 180 are sequentially laminated. A constitution including the hole injection layer 171, the hole transport layer 172, the emission layer 173, the electron transport layer 174, and the electron injection layer 175 may form an organic emission layer 170.

First, the hole injection layer 171 may be disposed on the first electrode 160. In this case, the hole injection layer 171 is a predetermined layer improving injection of holes from the first electrode 160 into the hole transport layer 172. The hole injection layer 171 may include cupper phthalocyanine (CuPc), poly 3,4-ethylenedioxythiophene (PEDOT), polyaniline (PANI), N,N-dinaphthyl-N,N'-diphenyl benzidine (NPD), and the like, but is not limited thereto.

The hole transport layer 172 may be disposed on the hole injection layer 171. The hole transport layer 172 may serve to smoothly transport holes transferred from the hole injection layer 171.

For example, the hole transport layer 172 may include a compound represented by the following Chemical Formulas 4 and 5.

Chemical Formula 4

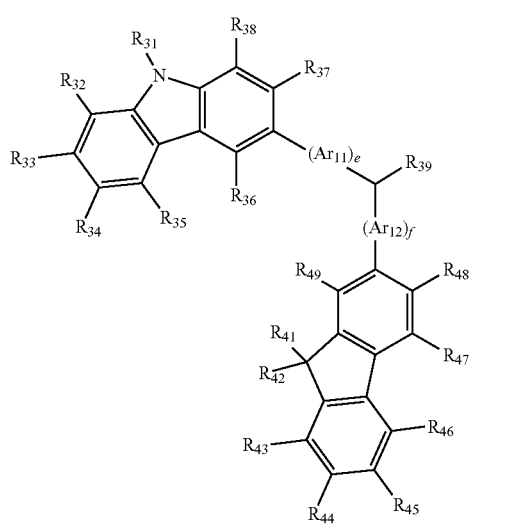

-continued

Chemical Formula 5

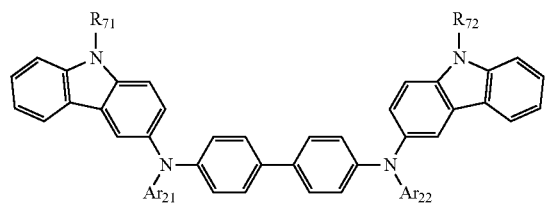

In Chemical Formulas 4 and 5, $Ar_{11}$, $Ar_{12}$, $Ar_{21}$, and $Ar_{22}$ are each independently a substituted or unsubstituted C6-C60 arylene group. e and f may each independently be an integer of 0 to 5.

$R_{31}$ to $R_{38}$, $R_{41}$ to $R_{49}$, and $R_{71}$ and $R_{72}$ may each independently be hydrogen, deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted C1-C60 alkyl group, a substituted or unsubstituted C2-C60 alkenyl group, a substituted or unsubstituted C2-C60 alkynyl group, a substituted or unsubstituted C1-C60 alkoxy group, a substituted or unsubstituted C3-C60 cycloalkyl group, a substituted or unsubstituted C6-C60 aryl group, a substituted or unsubstituted C6-C60 aryloxy group, or a substituted or unsubstituted C6-C60 arylthio group.

Further, $R_{39}$ may be any one of a phenyl group, a naphthyl group, an anthryl group, a biphenyl group, a pyridyl group, deuterium, a halogen atom, a hydroxyl group, a cyano group, a nitro group, an amino group, an amidino group, a hydrazine group, a hydrazone group, a carboxyl group or a salt thereof, a sulfonic acid group or a salt thereof, a phosphoric acid or a salt thereof, a substituted or unsubstituted C1-C20 alkyl group, and a substituted or unsubstituted C1-C20 alkoxy group.

Chemical Formulas 4 and 5 may have the following examples, but are not limited thereto:

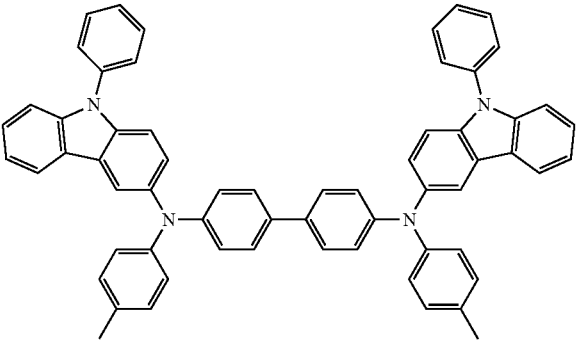
302

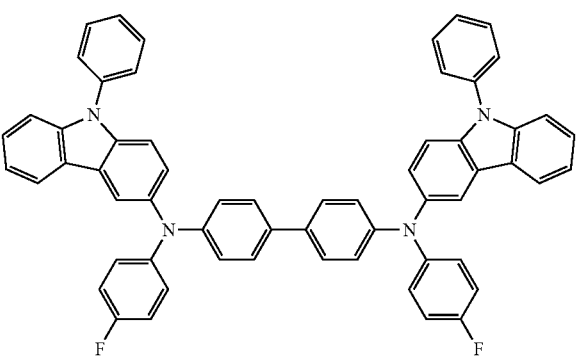
303

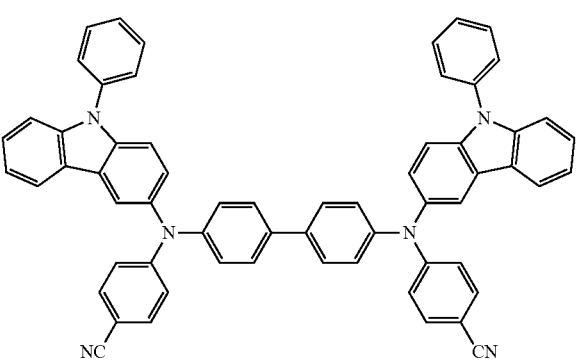
304

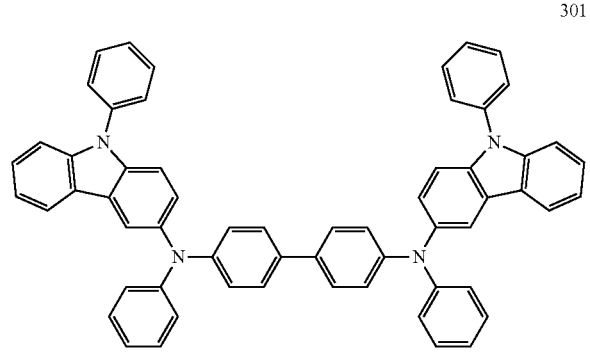
301

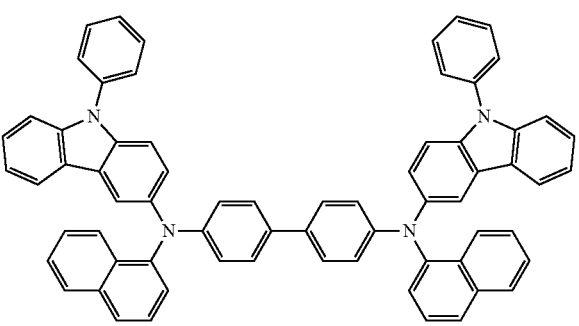
305

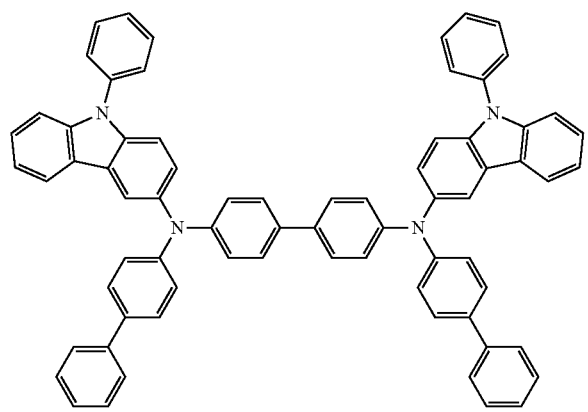
306

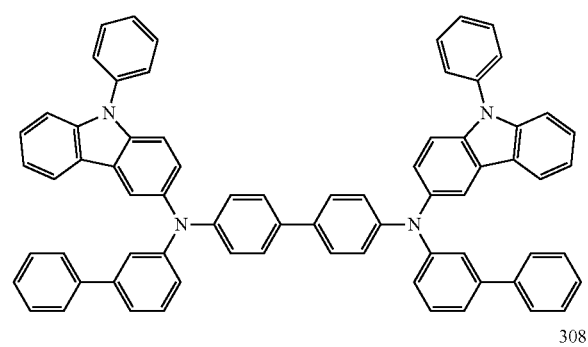
307

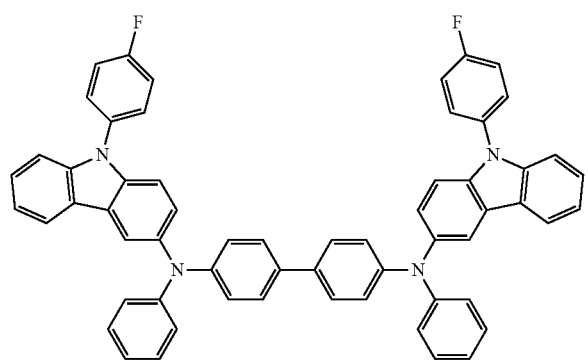
308

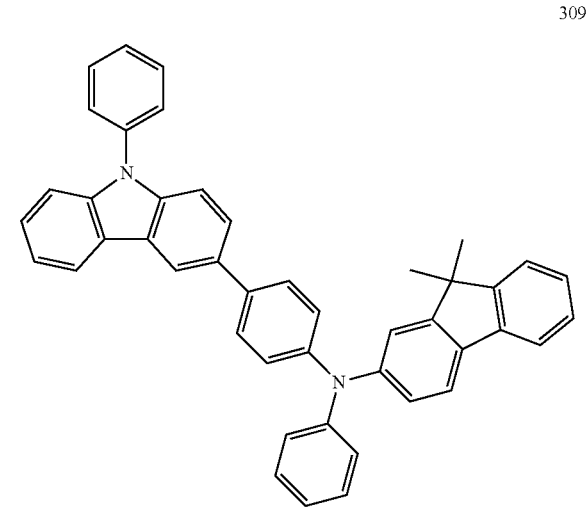
309

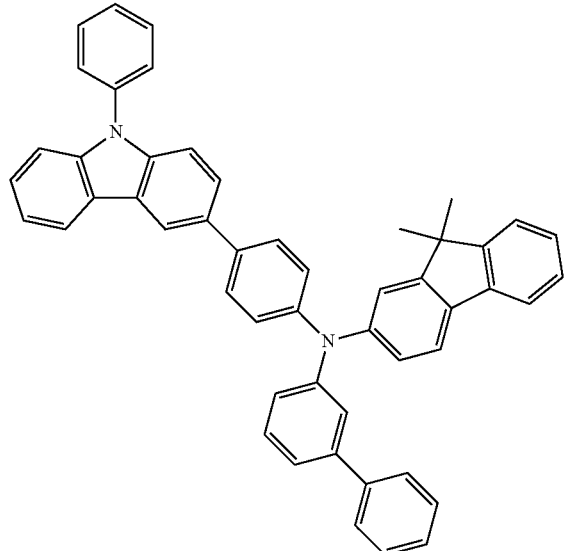
310

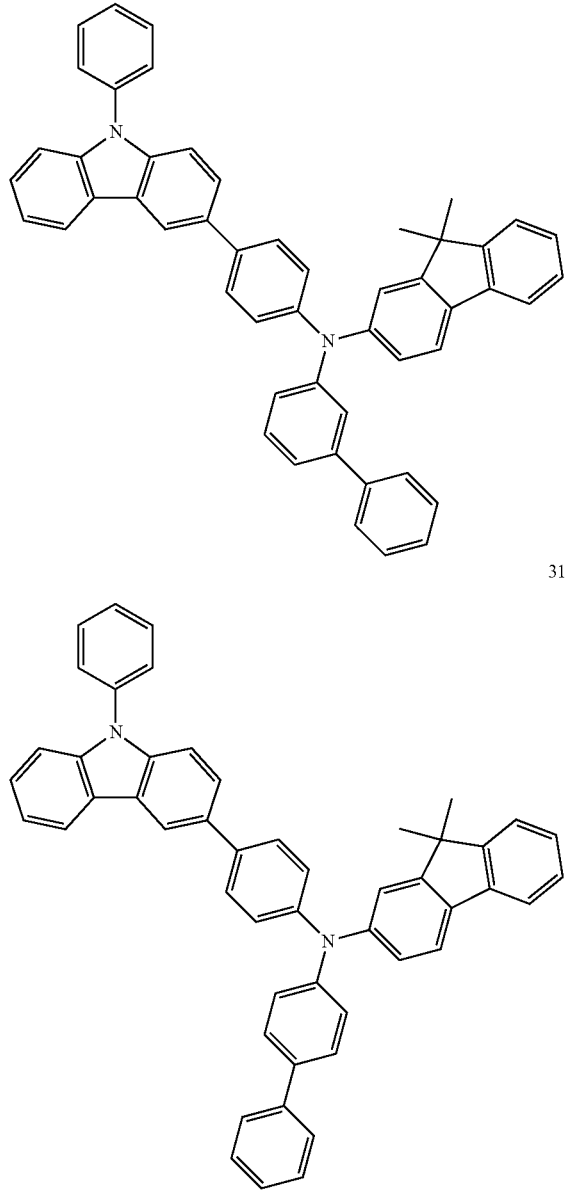
311

In the present example embodiment, formation of the structure where the hole injection layer 171 and the hole transport layer 172 are laminated is described, but is not limited thereto, and the hole injection layer 171 and the hole transport layer 172 may be formed of a single layer.

The emission layer 173 includes a light emitting material displaying a predetermined color. For example, the emission layer 173 may display primary colors such as a blue, green, or red color, or a combination color thereof.

The emission layer 173 includes a host and a dopant. The emission layer 173 may include a material emitting red, green, blue, and white light, and may be formed by using a phosphorescent or fluorescent material.

The emission layer 173 according to the example embodiment may include at least one of the compounds represented by the following Chemical Formulas 1 to 3, and the compounds represented by the following Chemical Formulas 1 to 3 may be the dopant of the emission layer.

Chemical Formula 1

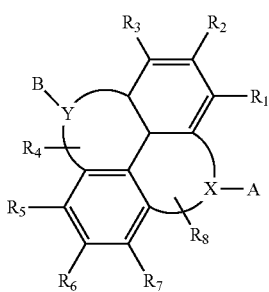

Chemical Formula 2

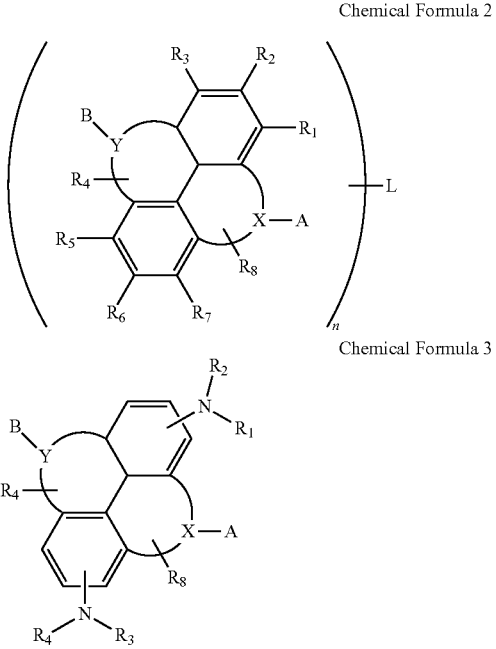

Chemical Formula 3

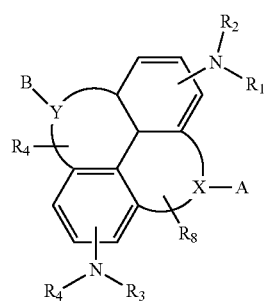

In Chemical Formulas 1, 2, and 3,

X and Y are each independently O, S, N, or Si, $R_1$ to $R_8$ and A and B are each independently a hydrogen atom, a deuterium atom, a halogen atom, a cyano group, a hydroxy group, a nitro group, a substituted or unsubstituted alkyl group having 1 to 30 carbon atoms, a substituted or unsubstituted cycloalkyl group having 3 to 10 carbon atoms, a substituted or unsubstituted alkylsilyl group having 3 to 30 carbon atoms, a substituted or unsubstituted arylsilyl group having 6 to 30 carbon atoms, a substituted or unsubstituted heteroaryl group having 4 to 30 carbon atoms, a substituted or unsubstituted condensed polycyclic group having 6 to 30 carbon atoms, a substituted or unsubstituted aryl group having 6 to 30 carbon atoms, an amine group substituted by a substituted or unsubstituted aryl group having 6 to 30 carbon atoms, an amine group substituted by a substituted or unsubstituted heteroaryl group having 4 to 30 carbon atoms, or an amine group substituted by a substituted or unsubstituted condensed polycyclic group having 6 to 30 carbon atoms. In an implementation, at least one of $R_1$ to $R_8$ is an amine group substituted by a substituted or unsubstituted aryl group having 6 to 30 carbon atoms, an amine group substituted by a substituted or unsubstituted heteroaryl group having 4 to 30 carbon atoms, or an amine group substituted by a substituted or unsubstituted condensed polycyclic group having 6 to 30 carbon atoms.

Further, L may be a ligand, and the ligand may include one or more of a substituted or unsubstituted alkyl group having 1 to 30 carbon atoms and a substituted or unsubstituted aryl group having 6 to 30 carbon atoms. Further, X and Y form a cycle.

Chemical Formulas 1 to 3 may have examples such as the following Chemical Formulas B-1 to B-8. However, the compound is not limited thereto, and other compounds having Structural Formulas of Chemical Formulas 1 to 3 are feasible.

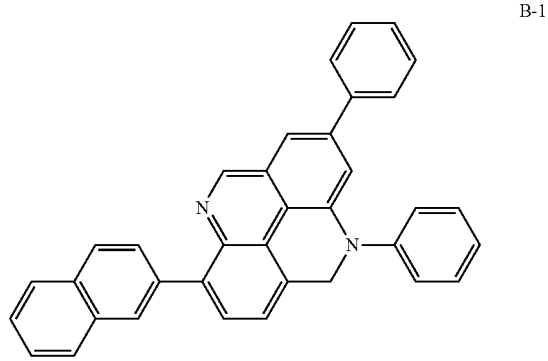

B-1

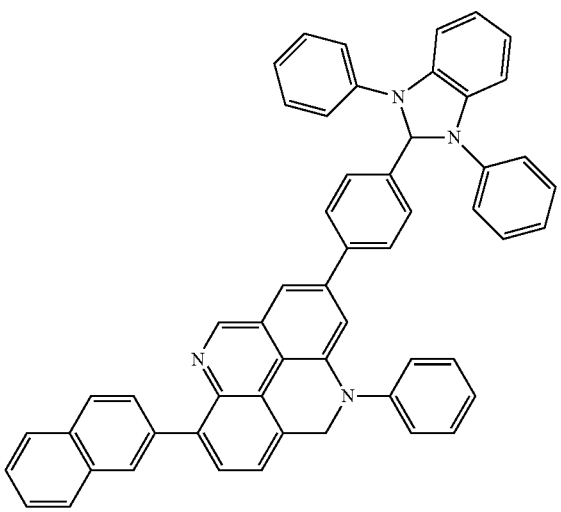

B-2

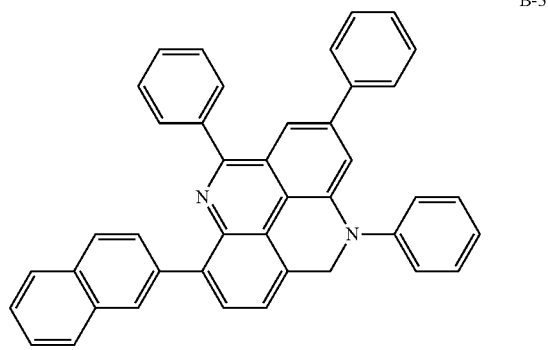

B-3

-continued

B-4
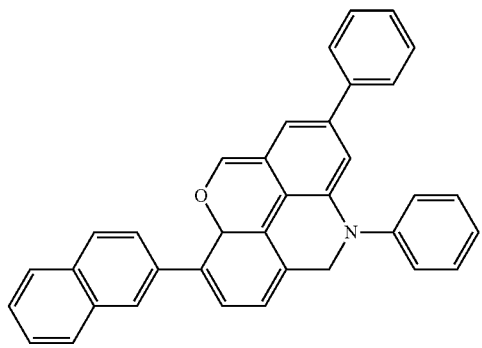

B-5
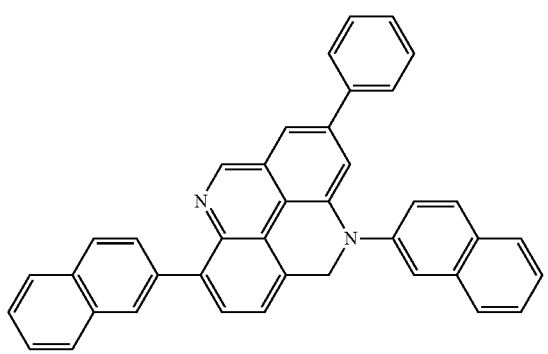

B-6
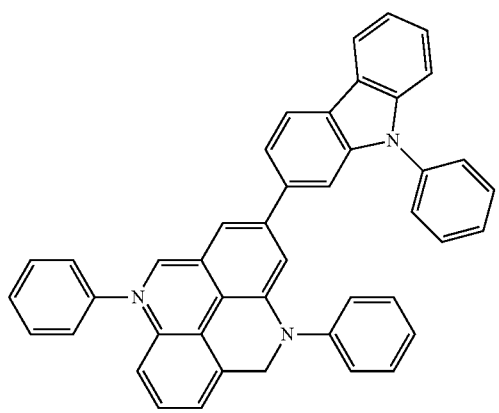

B-7
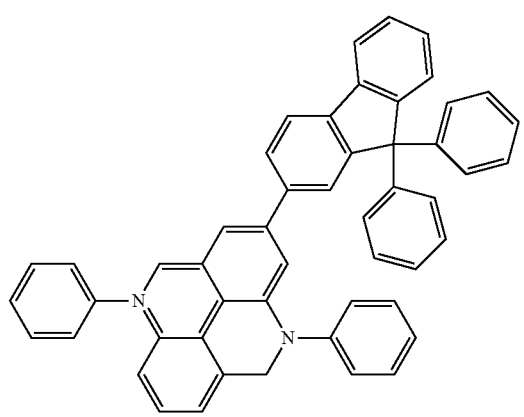

-continued

B-8
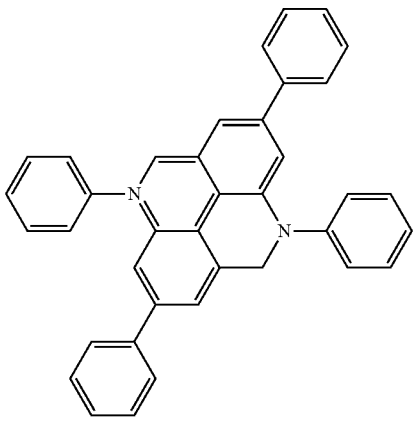

Meanwhile, in the case where the emission layer 173 emits red light, the emission layer may be formed of a phosphorescent material including a host material including carbazole biphenyl (CBP) or 1,3-bis(carbazol-9-yl (mCP) and a dopant including one or more selected from the group of bis(1-phenylisoquinoline)acetylacetonate iridium (PIQIr (acac), bis(1-phenylquinoline)acetylacetonate iridium (PQIr (acac), (tris(1-phenylquinoline)iridium (PQIr), and octaethylporphyrin platinum (PtOEP) in addition to the compound represented by Chemical Formulas 1 to 3, or the emission layer may be formed of a fluorescent material including PBD:Eu(DBM)$_3$(Phen) or perylene, but is not limited thereto.

In the case where the emission layer 173 emits green light, the emission layer 173 may be formed of a phosphorescent material including a host material including CBP (carbazole biphenyl) or mCP (1,3-di(9H-carbazol-9-yl)benzene) and a dopant material including (fac-tris (2-phenylpyridine) iridium (Ir(ppy)$_3$) in addition to the compound represented by Chemical Formulas 1 to 3, or the emission layer may be formed of a fluorescent material including (tris(8-hydroxyquinolino)aluminum (Alq$_3$), but is not limited thereto.

In the case where the emission layer 173 emits blue light, the emission layer 173 may be formed of a phosphorescent material including a host material including CBP or mCP and a dopant material including (4,6-F2ppy)$_2$Irpic in addition to the compound represented by Chemical Formulas 1 to 3. In another implementation, the emission layer 173 may be formed of a fluorescent material including any one selected from the group of spiro-DPVBi, spiro-6P, distilbenzene (DSB), distyrylarylene (DSA), a PFO-based polymer, and a PPV-based polymer, but is not limited thereto.

According to the present example embodiment, the compound represented by Chemical Formulas 1 to 3 may be the dopant of the emission layer. Further, the color of light emitted by the emission layer is not limited, but for example, the compound may be the dopant of the blue emission layer.

Meanwhile, the electron transport layer 174 may be disposed on the emission layer 173. In this case, the electron transport layer 174 may transfer electrons from the second electrode 180 to the emission layer 173. Further, the electron transport layer 174 may prevent holes injected from the first electrode 160 from moving to the second electrode 180 through the emission layer 173. That is, the electron transport layer 174 serves as a hole blocking layer to help combination of the holes and the electrons in the emission layer 173.

In this case, the electron transport layer 174 may be formed of one or more selected from the group of (tris(8-hydroxyquinolino)aluminum (Alq3), PBD, TAZ, Spiro-PBD, BAlq, and SAlq, but is not limited thereto.

The electron injection layer 175 is formed on the electron transport layer 174. The electron injection layer 175 is a predetermined layer improving injection of the electrons from the second electrode 180 into the electron transport layer 174. The electron injection layer 175 may include $Alq_3$, LiF, a gallium mixture (Ga complex), PBD, and the like, but is not limited thereto.

The aforementioned dopant of Chemical Formulas 1, 2, and 3 may be used in the organic light emitting display element, and this display element may provide light emitting efficiency and the element life span required in the display device.

Figure 2:
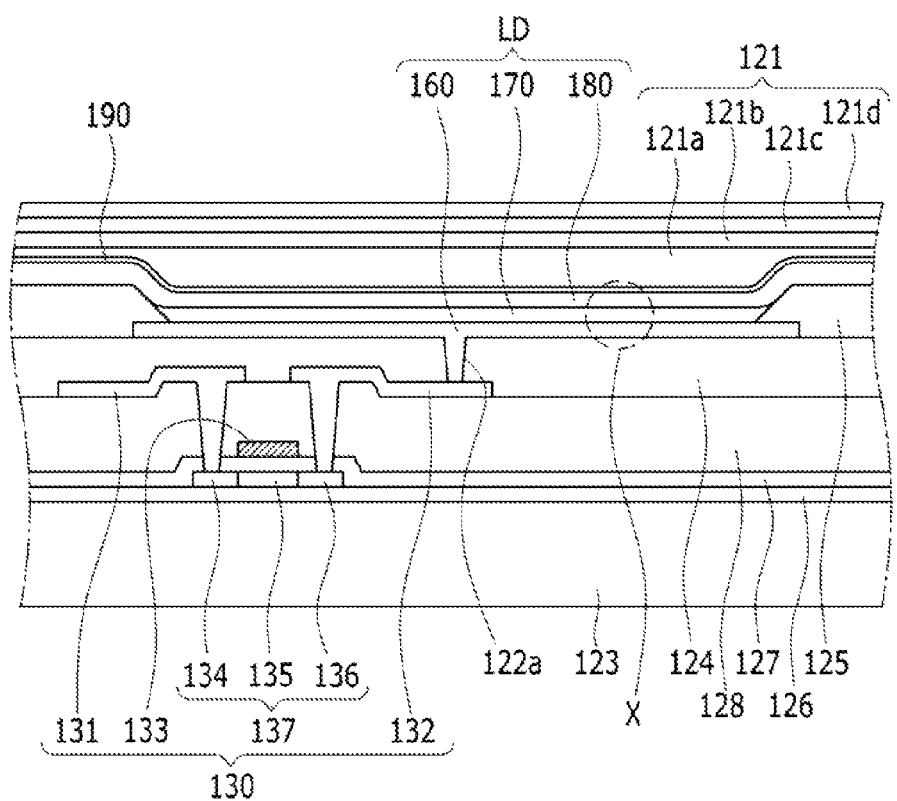
FIG. 2 illustrated a partial cross-sectional view mainly illustrating a thin film transistor and an organic light emitting element used in an organic light emitting diode display according to an example embodiment.

Hereinafter, an organic light emitting diode display including the aforementioned organic light emitting display element will be described with reference to FIG. 2.

The organic light emitting diode display according to an example embodiment includes an insulation substrate 123, a thin film transistor 130, a first electrode 160, first layers 171 and 172, an emission layer 173, second layers 174 and 175, and a second electrode 180. Specifically, the organic emission layer 170 of FIG. 2 includes the hole injection layer 171, the hole transport layer 172, the emission layer 173, the electron transport layer 174, and the electron injection layer 175 of FIG. 1.

First, the insulation substrate 123 is formed of an insulation substrate made of glass, quartz, ceramics, plastics, and the like. However, the example embodiment is not limited thereto, and the insulation substrate 123 may be formed of a metal substrate made of stainless steel and the like.

In addition, a substrate buffer layer 126 is positioned on the insulation substrate 123. The substrate buffer layer 126 serves to prevent penetration of impurities and planarize a surface.

In this case, the substrate buffer layer 126 may be formed of various materials that can perform the aforementioned function. For example, as the substrate buffer layer 126, any one of a silicon nitride ($SiN_x$) layer, a silicon oxide ($SiO_y$) layer, and a silicon oxynitride ($SiO_xN_y$) layer may be used. However, the substrate buffer layer 126 may be omitted according to the kind and the process condition of the substrate 123.

A driving semiconductor layer 137 is positioned on the substrate buffer layer 126. The driving semiconductor layer 137 is formed of a polysilicon film. The driving semiconductor layer 137 includes a channel region 135 in which an impurity is not doped, and a source region 134 and a drain region 136 formed by being doped at both sides of the channel region 135. In this case, a doped ion material is a p type impurity such as boron (B), and $B_2H_6$ is mainly used. Herein, this impurity varies according to the kind of thin film transistor.

A gate insulating layer 127 formed of silicon nitride ($SiN_x$) or silicon oxide ($SiO_y$) is positioned on the driving semiconductor layer 137. A gate wire including a driving gate electrode 133 is formed on the gate insulating layer 127. In addition, the driving gate electrode 133 is formed so as to overlap at least a portion of the driving semiconductor layer 137, particularly, the channel region 135.

Meanwhile, an interlayer insulating layer 128 covering the driving gate electrode 133 is positioned on the gate insulating layer 127. In the gate insulating layer 127 and the interlayer insulating layer 128, contact holes through which the source region 134 and the drain region 136 of the driving semiconductor layer 137 are exposed are formed. The interlayer insulating layer 128, like the gate insulating layer 127, may be made of a ceramic-based material such as silicon nitride ($SiN_x$) or silicon oxide ($SiO_y$).

In addition, a data wire including a driving source electrode 131 and a driving drain electrode 132 is formed on the interlayer insulating layer 128. Further, the driving source electrode 131 and the driving drain electrode 132 are connected to the source region 134 and the drain region 136 of the driving semiconductor layer 137, respectively, through through-holes formed in the interlayer insulating layer 128 and the gate insulating layer 127.

As described above, the driving thin film transistor 130 is formed to include the driving semiconductor layer 137, the driving gate electrode 133, the driving source electrode 131, and the driving drain electrode 132. The constitution of the driving thin film transistor 130 is not limited to the aforementioned examples, but can be variously modified.

In addition, a planarization layer 124 covering the data wire is positioned on the interlayer insulating layer 128. The planarization layer 124 serves to remove a step and perform planarization in order to increase light emitting efficiency of the organic light emitting element to be formed thereon. Further, the planarization layer 124 has an electrode contact hole 122a through which a portion of the drain electrode 132 is exposed.

The planarization layer 124 may be made of one or materials of an acryl-based resin (polyacrylates resin), an epoxy resin, a phenol resin, a polyamide-based resin (polyamides resin), a polyimide-based rein (polyimides resin), an unsaturated polyester-based resin (unsaturated polyesters resin), a polyphenylene-based resin (polyphenylenethers resin), a polyphenylene sulfide-based resin (polyphenylenesulfides resin), and benzocyclobutene (BCB).

The present example embodiment is not limited to the aforementioned structure, and any one of the planarization layer 124 and the interlayer insulating layer 128 may be omitted.

The first electrode 160 of the organic light emitting display element, that is, the pixel electrode 160, is formed on the planarization layer 124. That is, the organic light emitting diode display includes a plurality of pixel electrodes 160 disposed for each of a plurality of pixels. In this case, the plurality of the pixel electrodes 160 is disposed to be spaced apart from each other. The pixel electrode 160 is connected to the drain electrode 132 through the electrode contact hole 122a of the planarization layer 124.

Further, a pixel definition layer 125 having an opening through which the pixel electrode 160 is exposed is formed on the planarization layer 124. That is, the pixel definition layer 125 has a plurality of openings, with openings formed for each pixel. In this case, the organic emission layer 170 may be formed for each opening formed by the pixel definition layer 125. Accordingly, a pixel region in which each organic emission layer is formed may be defined by the pixel definition layer 125.

In this case, the pixel electrode 160 is disposed so as to correspond to the opening of the pixel definition layer 125. However, the pixel electrode 160 is not necessarily disposed in only the opening of the pixel definition layer 125, but a portion of the pixel electrode 160 may be disposed under the pixel definition layer 125 so as to overlap the pixel definition layer 125.

The pixel definition layer 125 may be made of resins such as a polyacryl-based resin (polyacrylates resin) and a polyimide-based resin (polyimides), silica-based inorganic materials, or the like.

Meanwhile, the organic emission layer 170 is formed on the pixel electrode 160. The organic emission layer 170 includes the aforementioned organic light emitting display element according to an embodiment.

In addition, the second electrode 180, that is, the common electrode 180, may be formed on the organic emission layer 170. As described above, the organic light emitting element LD including the pixel electrode 160, the organic emission layer 170, and the common electrode 180 is formed.

In this case, the pixel electrode 160 and the common electrode 180 may be each formed of a transparent conductive material, or a transflective or reflective conductive material. According to the kind of material forming the pixel electrode 160 and the common electrode 180, the organic light emitting diode display may be a top emission type, a bottom emission type, or a dual emission type.

Meanwhile, an overcoat 190 covering the common electrode 180 to protect the common electrode 180 may be positioned as an organic layer on the common electrode 180.

In addition, a thin film encapsulation layer 121 is positioned on the overcoat 190. The thin film encapsulation layer 121 provides sealing to protect the organic light emitting element LD and a driving circuit portion formed on the substrate 123 from the outside.

The thin film encapsulation layer 121 includes encapsulation organic layers 121a and 121c and encapsulation inorganic layers 121b and 121d that are alternately laminated one by one. FIG. 1 illustrates, for example, the case where two encapsulation organic layers 121a and 121c and two encapsulation inorganic layers 121b and 121d are alternately laminated one by one to constitute the thin film encapsulation layer 121, but the thin film encapsulation layer is not limited thereto.

The organic light emitting diode display may include the organic light emitting display element including a novel light emitting dopant, and may provide appropriate life span and light emitting efficiency therethrough.

Hereinafter, an Example of the organic light emitting display element and efficiency thereof are described.

The following Example is provided in order to highlight characteristics of one or more embodiments, but it will be understood that the Example is not to be construed as limiting the scope of the embodiments. Further, it will be understood that the embodiments are not limited to the particular details described in the Example.

EXAMPLE 1

First, a Corning 15 $\Omega/cm^2$ (1200 Å) ITO glass substrate was cut in the size of 50 mm ×50 mm×0.7 mm. The glass substrate was subjected to ultrasonic wave washing by using isopropyl alcohol for 5 minutes and pure water for 5 minutes, ultraviolet rays were radiated for 30 minutes, followed by exposure to ozone and washing, and the glass substrate that was the anode was installed in the vacuum deposition device.

Next, the compound represented by the following Chemical Formula 401 was deposited under the vacuum on the upper portion of the substrate to form the hole injection layer having the thickness of 600 Å, and subsequently, the compound represented by the following Chemical Formula 402 was deposited under the vacuum in the thickness of 400 Å to form the hole transport layer.

Next, the compound represented by the following Chemical Formula 403 was used as the blue fluorescent host on the upper portion of the hole transport layer, and the compound represented by the Chemical Formula B-2 according to the example embodiment was used as the blue fluorescent dopant, and both compounds were simultaneously deposited at the weight ratio of 95:5 to form the emission layer having the thickness of 20 nm.

Next, the compound represented by the following Chemical Formula 405 was deposited in the thickness of 300 Å on the upper portion of the emission layer to form the electron transport layer, LiF that was the halogenated alkali metal was deposited in the thickness of 10 Å on the upper portion of the electron transport layer to form the electron injection layer, and Al was deposited under the vacuum in the thickness of 1000 Å to form the LiF/Al cathode, thereby manufacturing the organic light emitting display element.

Chemical Formula 401

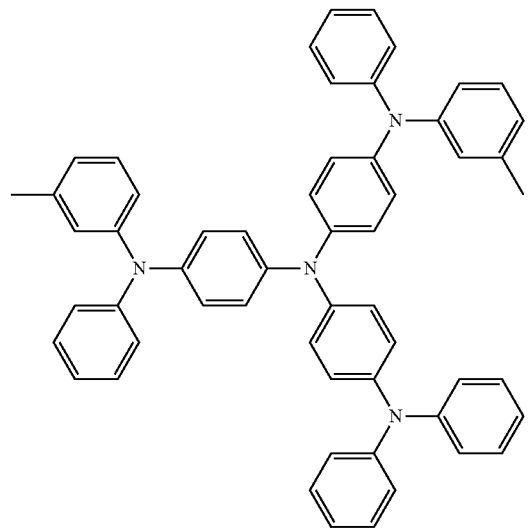

Chemical Formula 402

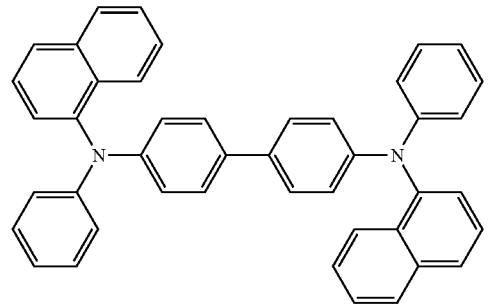

Chemical Formula 403

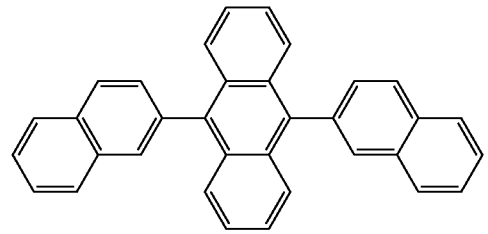

-continued

Chemical Formula 405

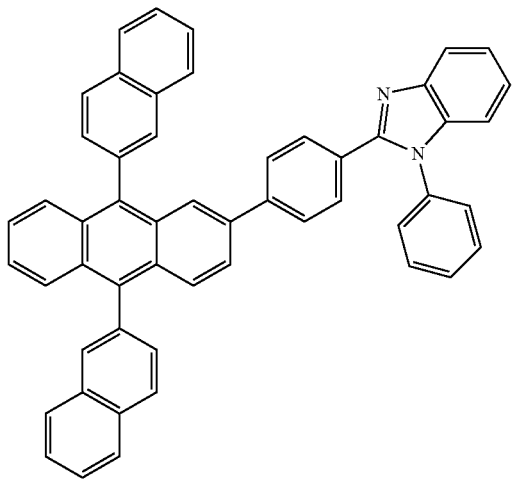

Physical properties of the organic light emitting display element according to Example 1 were as follows.

TABLE 1

| Organic light emitting element | Driving voltage [V] | Efficiency [cd/A] | Life span |
|---|---|---|---|
| Example 1 | 4.0 | 1.10 | 1.25 |

It was confirmed that in the case of the organic light emitting display element including the dopant according to an example embodiment, a driving voltage required in the display device could be provided, and thus light emitting efficiency and element life span capable of being used in the display device could be provided.

By way of summation and review, in the case where the holes and the electrons are off-balance, the organic layer may be damaged, and thus a characteristic of an organic light emitting element may become unstable to reduce light emitting efficiency or shorten a life span.

As described above, embodiments may provide an emission layer having excellent element life span and light emitting efficiency, and an organic light emitting diode display including the same. Embodiments may provide an organic light emitting diode display having improved element life span and light emitting efficiency.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope as set forth in the following claims.

What is claimed is:

1. An organic light emitting diode display, comprising:
an organic light emitting diode, the organic light emitting diode including an emission layer that contains a compound represented by the following Chemical Formula A:

Chemical Formula A

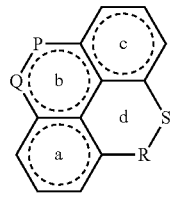

wherein, in Chemical Formula A, rings a, b, and c are aromatic,

P and Q of ring b are N or CH, one of P and Q being N and the other of P and Q being CH, R and S of ring d are NR' or CH$_2$, one of R and S being NR' and the other of R and S being CH$_2$, R' is a substituted or unsubstituted aryl group having 6 to 30 carbon atoms, a substituted or unsubstituted condensed polycyclic group having 6 to 30 carbon atoms, an amine group substituted by a substituted or unsubstituted heteroaryl group having 4 to 30 carbon atoms, or an amine group substituted by a substituted or unsubstituted condensed polycyclic group having 6 to 30 carbon atoms, rings a and c are independently unsubstituted or substituted with one or more of a halogen atom, a cyano group, a hydroxy group, a nitro group, a substituted or unsubstituted alkyl group having 1 to 30 carbon atoms, a substituted or unsubstituted cycloalkyl group having 3 to 10 carbon atoms, a substituted or unsubstituted alkylsilyl group having 3 to 30 carbon atoms, a substituted or unsubstituted arylsilyl group having 6 to 30 carbon atoms, a substituted or unsubstituted heteroaryl group having 4 to 30 carbon atoms, a substituted or unsubstituted condensed polycyclic group having 6 to 30 carbon atoms, a substituted or unsubstituted aryl group having 6 to 30 carbon atoms, an amine group substituted by a substituted or unsubstituted aryl group having 6 to 30carbon atoms, an amine group substituted by a substituted or unsubstituted heteroaryl group having 4 to 30 carbon atoms, or an amine group substituted by a substituted or unsubstituted condensed polycyclic group having 6 to 30 carbon atoms.

2. The organic light emitting diode display as claimed in claim 1, wherein the compound represented by the Chemical Formula A is represented by one of the following Chemical Formulas B-1, B-2, or B-5:

B-1

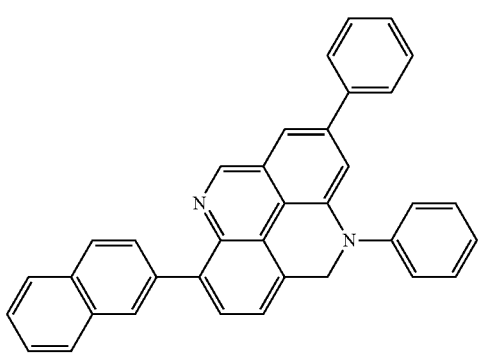

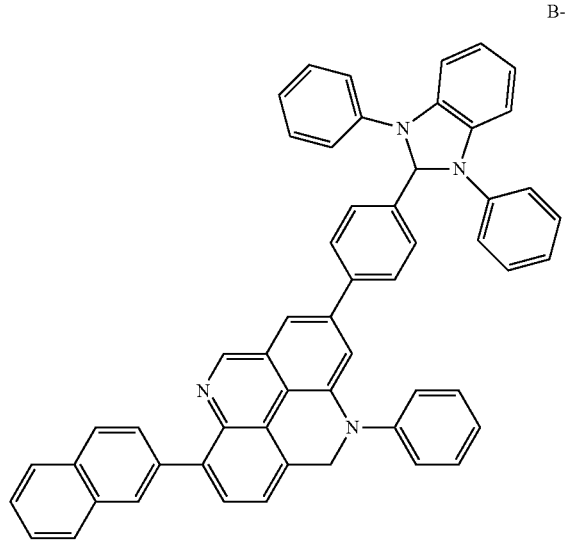

B-2

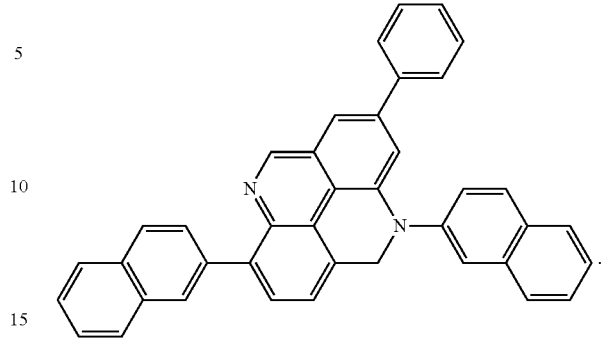

B-5

3. The organic light emitting diode display as claimed in claim 1, wherein the compound represented by the Chemical Formula A is a dopant in the emission layer, the dopant being mixed in the emission layer with a host, the host including one or more of carbazole biphenyl, 1,3-di(9H-carbazol-9-yl)benzene, or 9,10-di(2-naphthyl)anthracene, the host and the dopant operating to emit blue light.

* * * * *